US010020326B2

(12) United States Patent
Huang et al.

(10) Patent No.: US 10,020,326 B2
(45) Date of Patent: Jul. 10, 2018

(54) CIRCUIT PROTECTION STRUCTURE AND DISPLAY DEVICE HAVING THE SAME

(71) Applicant: E Ink Holdings Inc., Hsinchu (TW)

(72) Inventors: Kai-Mao Huang, Hsinchu (TW); Pei-Lin Huang, Hsinchu (TW); Yi-Ming Wu, Hsinchu (TW); Shu-Ping Yan, Hsinchu (TW)

(73) Assignee: E Ink Holdings Inc., Hsinchu (TW)

( * ) Notice: Subject to any disclaimer, the term of this patent is extended or adjusted under 35 U.S.C. 154(b) by 0 days.

(21) Appl. No.: 14/698,861

(22) Filed: Apr. 29, 2015

(65) Prior Publication Data
US 2016/0013217 A1  Jan. 14, 2016

(30) Foreign Application Priority Data
Jul. 14, 2014  (TW) .............................. 103124135 A

(51) Int. Cl.
H01L 27/12  (2006.01)
H01L 29/04  (2006.01)
H01L 29/786  (2006.01)

(52) U.S. Cl.
CPC ........ H01L 27/1248 (2013.01); H01L 27/124 (2013.01); H01L 27/1222 (2013.01); H01L 29/78633 (2013.01)

(58) Field of Classification Search
CPC ........... H01L 27/1248; H01L 29/78633; H01L 27/1222; H01L 27/124
See application file for complete search history.

(56) References Cited

U.S. PATENT DOCUMENTS

| 8,373,836 | B2 | 2/2013 | Tsai et al. | |
| 2003/0094614 | A1* | 5/2003 | Yamazaki | G02F 1/13454 257/72 |
| 2004/0141128 | A1* | 7/2004 | Kim | G02F 1/13454 349/138 |
| 2005/0168135 | A1* | 8/2005 | Iga | H01L 27/3272 313/500 |
| 2006/0066604 | A1* | 3/2006 | Yang | G02F 1/1339 345/204 |
| 2007/0164330 | A1 | 7/2007 | Jeong et al. | |
| 2010/0283929 | A1* | 11/2010 | Ahn | G06Q 10/10 349/43 |

(Continued)

FOREIGN PATENT DOCUMENTS

| CN | 102054831 A | 5/2011 |
| CN | 203133439 U | 8/2013 |
| TW | 201332118 A1 | 8/2013 |

OTHER PUBLICATIONS

Corresponding Taiwanese Office Action that this art reference was cited on Mar. 21, 2016.
Corresponding Chinese office action dated Sep. 21, 2017.

Primary Examiner — Su C Kim
(74) Attorney, Agent, or Firm — CKC & Partners Co., Ltd.

(57) ABSTRACT

A circuit protection structure applied to a gate driver that is in a display panel (GIP) is provided. The gate driver has a first metal layer, a first isolation layer, a semiconductor layer, a second metal layer, and a second isolation layer. The first metal layer, the first isolation layer, the semiconductor layer, the second metal layer, and the second isolation layer are stacked in sequence. The circuit protection structure includes a protection layer. The protection layer is located on the second isolation layer.

15 Claims, 3 Drawing Sheets

(56) References Cited

U.S. PATENT DOCUMENTS

| | | | |
|---|---|---|---|
| 2011/0080384 A1 | 4/2011 | Liu et al. | |
| 2011/0102696 A1* | 5/2011 | Yamazaki | G02F 1/13458 |
| | | | 349/42 |
| 2011/0134104 A1 | 6/2011 | Yoon et al. | |
| 2012/0075270 A1* | 3/2012 | Kitakado | G02F 1/133512 |
| | | | 345/204 |
| 2012/0256973 A1 | 10/2012 | Choi et al. | |
| 2012/0287525 A1* | 11/2012 | Matsui | G02F 1/133516 |
| | | | 359/891 |
| 2013/0169913 A1* | 7/2013 | Choi | G02F 1/133512 |
| | | | 349/110 |
| 2014/0036119 A1* | 2/2014 | Shimomura | H01L 27/14603 |
| | | | 348/294 |

* cited by examiner

CIRCUIT PROTECTION STRUCTURE AND DISPLAY DEVICE HAVING THE SAME

RELATED APPLICATIONS

This application claims priority to Taiwanese Application Serial Number 103124135, filed Jul. 14, 2014, which is herein incorporated by reference.

BACKGROUND

Field of Invention

The present invention relates to a circuit protection structure and a display device having the circuit protection structure.

Description of Related Art

GIP (gate-driver in panel) driving circuits may be utilized to drive display panels in an electronic book or other display devices. In manufacturing the GIP driving circuits, integrated circuits (IC) at a gate side are directly disposed adjacent to the edge of a glass substrate to decrease the number of the integrated circuits. Such GIP technique can be used in a display device having a narrow frame, and the cost of the display device can be reduced.

However, the gate driver of the GIP driving circuit may suffer some problems, such as moisture entering the lines of the GIP driving circuit, or scratches formed on the GIP driving circuit during the manufacturing process. As a result, the yield rate and the product reliability of the display device having the gate driver will be affected. Moreover, the gate driver often has a semiconductor layer made of amorphous silicon (a-Si). When the amorphous silicon is irradiated by sunlight or strong light, the electric leakage of the gate driver is prone to occur, which induces abnormal output signal of the gate driver.

SUMMARY

An aspect of the present invention is to provide a circuit protection structure applied in a gate driver of a display panel. The gate driver has a first metal layer, a first isolation layer, a semiconductor layer, a second metal layer, and a second isolation layer stacked in sequence.

According to an embodiment of the present invention, a circuit protection structure includes a protection layer. The protection layer is located on the second isolation layer.

In one embodiment of the present invention, the circuit protection structure further includes a light shielding layer. The light shielding layer is located on the protection layer, such that the protection layer is between the light shielding layer and the second isolation layer.

In one embodiment of the present invention, the material of he light shielding layer is the same as the material of the first metal layer.

In one embodiment of the present invention, the material of the light shielding layer s the same as the material of the second metal layer.

In one embodiment of the present invention, the thickness of the light shielding layer is in a range from 400 Å to 600 Å.

In one embodiment of the present invention, the light shielding layer overlaps the protection layer.

In one embodiment of the present invention, the protection layer is made of a material including photoresist.

In one embodiment of the present invention, the thickness of the protection layer is in a range from 22,000 Å to 24,000 Å.

Another aspect of the present invention is to provide a display device.

According to an embodiment of the present invention, a display device includes a display panel and a circuit protection structure. The display panel has a gate driver and a substrate. The gate driver is located on the substrate and includes a first metal layer, a first isolation layer, a semiconductor layer, a second metal layer, and a second isolation layer. The first metal layer is located on the substrate. The first isolation layer is located on the first metal layer. The semiconductor layer is located on the first isolation layer. The second metal layer is located on the semiconductor layer. The second isolation layer covers the second metal layer and the semiconductor layer. The circuit protection structure is located on the gate driver and includes a protection layer. The protection layer is located on the second isolation layer.

In one embodiment of the present invention, the circuit protection structure includes a light shielding layer. The light shielding layer is located on the protection layer, such that the protection layer is between the light shielding layer and the second isolation layer.

In one embodiment of the present invention, the material of the light shielding layer is the same as the material of the first metal layer.

In one embodiment of the present invention, the material of the light shielding layer s the same as the material of the second metal layer.

In one embodiment of the present invention, the thickness of the light shielding layer is in a range from 400 Å to 600 Å.

In one embodiment of the present invention, the light shielding layer overlaps the protection layer.

In one embodiment of the present invention, the protection layer is made of a material including photoresist.

In one embodiment of the present invention, the thickness of the protection layer is in a range from 22,000 Å to 24,000 Å.

In one embodiment of the present invention, the display device further includes a controller. The controller is electrically connected to the gate driver.

In the aforementioned embodiments of the present invention, since the protection layer of the circuit protection structure is located on the second isolation layer of the gate driver, the probability of moisture entering the circuit region of the gate driver may be effectively reduced and the scratch problem of the gate driver may be prevented during a subsequent process. As a result, the display device having the circuit protection structure may significantly improve the yield rate and the product reliability thereof, such that the display device has good product competitiveness.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiments, with reference made to the accompanying drawings as follows.

DETAILED DESCRIPTION

Figure 1:
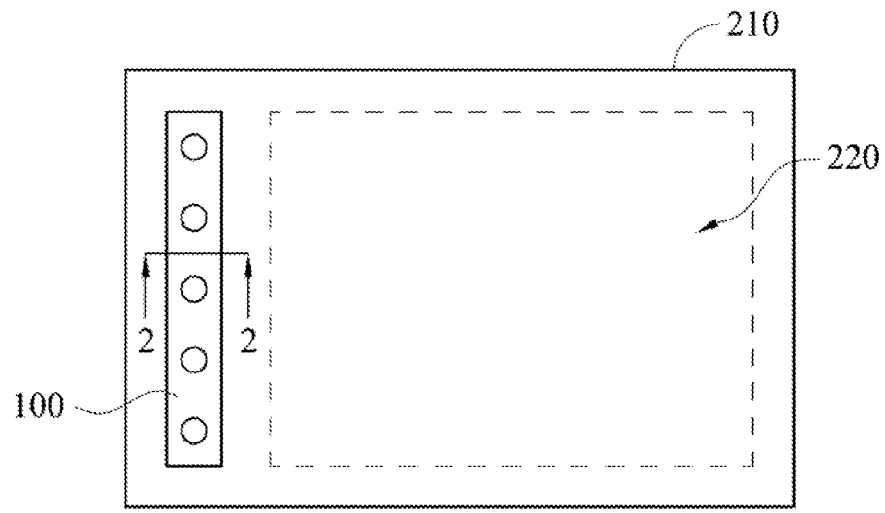
FIG. 1 is a top view of a display device according to one embodiment of the present invention.

Reference will now be made in detail to the present embodiments of the invention, examples of which are illustrated in the accompanying drawings. Wherever possible, the same reference numbers are used in the drawings and the description to refer to the same or like parts.

Figure 2:
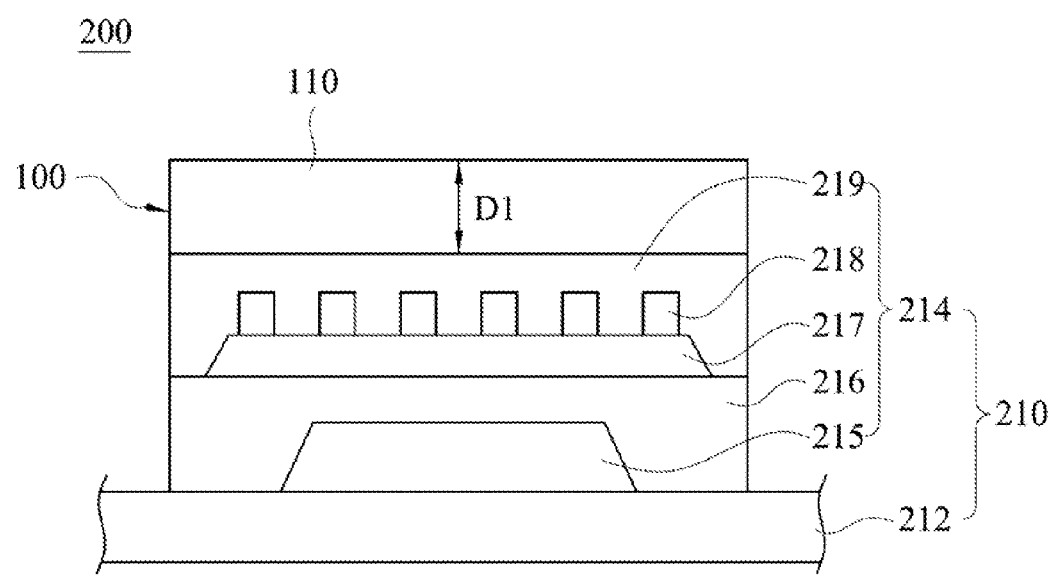
FIG. 2 is a cross-sectional view of he display device taken along line 2-2 shown in FIG. 1.

FIG. 1 is a top view of a display device 200 according to one embodiment of the present invention. FIG. 2 is a cross-sectional view of the display device 200 taken along line 2-2 shown in FIG. 1, As shown in FIG. 1 and FIG. 2, the display device 200 includes a display panel 210 and a circuit protection structure 100. The display panel 210 has a substrate 212 and a gate driver 214. The gate driver 214 is located on the substrate 212, and the circuit protection structure 100 is applied in the gate driver 214 in the display panel 210.

In this embodiment, the gate driver 214 is located on the surface of the substrate 212 and adjacent to the edge of the substrate 212. The gate driver 214 has a first metal layer 215, a first isolation layer 216, a semiconductor layer 217, a second metal layer 218, and a second isolation layer 219 that are stacked in sequence. That is to say, the first metal layer 215 is located on the substrate 212, the first isolation layer 216 is located on the first metal layer 215, the semiconductor layer 217 is located on the first isolation layer 216, the second metal layer 218 is located on the semiconductor layer 217, and the second isolation layer 219 covers the second metal layer 218 and the semiconductor layer 217.

The circuit protection structure 100 is located on the gate driver 214 and includes a protection layer 110. The protection layer 110 is located on the second isolation layer 219 of the gate driver 214. The first and second metal layers 215, 218 of the gate driver 214 may be regarded as the circuit region of the gate driver 214 for transmitting signals. In use, the gate driver 214 may turn on or turn off the display region 220 of the display device 200 (i.e., the area surrounded by the dotted line shown in FIG. 1).

Since the protection layer 110 of the circuit protection structure 100 is located on the second isolation layer 219 of the gate driver 214, the probability of moisture entering the circuit region of the gate driver 214 may be effectively reduced and the scratch problem of the gate driver 214 may be prevented during a subsequent process. As a result, the display device 200 having the circuit protection structure 100 may significantly improve the yield rate and the product reliability thereof, such that the display device 200 has good product competitiveness.

The gate driver 214 and the circuit protection structure 100 of the present invention are directly disposed on a position adjacent to the edge of the substrate 212 to decrease the number of the integrated circuits (IC). Therefore, the cost of the display device 200 can be reduced. Moreover, the gate driver 214 and the circuit protection structure 100 may be used in the display device 200 that designed with a narrow frame, thereby more flexible for designers.

In this embodiment, the protection layer 110 may be made of a material including photoresist. The thickness of the protection layer 110 may be in a range from 22,000 Å to 24,000 Å, such as 23,000 Å. The first and second metal layers 215, 218 may be made of a material including titanium, aluminum, and alloy thereof. The semiconductor layer 217 may be made of a material including amorphous silicon (a-Si). However, the present invention is not limited by the aforesaid materials. Moreover, the first and second metal layers 215, 218, the first and second isolation layers 216, 219, the semiconductor layer 217, and the protection layer 110 may be formed on the substrate 212 by photolithography technique. The photolithography technique may include exposure process, development process, etching process, etc.

Figure 3:
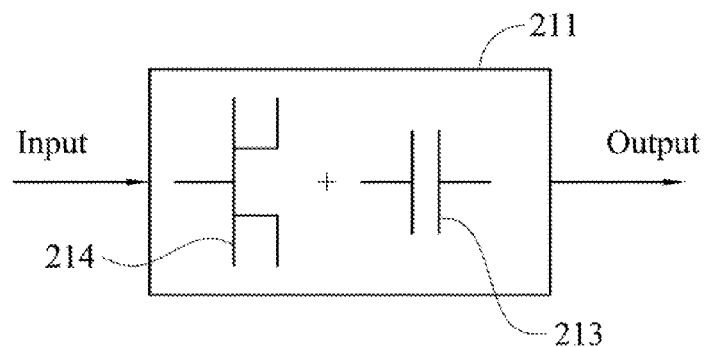
FIG. 3 is a schematic view of a driving circuit formed by a gate driver shown in FIG. 2.

FIG. 3 is a schematic view of a driving circuit 211 formed by the gate driver 214 shown in FIG. 2. As shown in FIG. 2 and FIG. 3, the GIP (gate-driver in panel) driving circuit 211 includes the gate driver 214 and a capacitance 213. The gate driver 214 is electrically connected to the capacitance 213, and the gate driver 214 and the capacitance 213 are formed on the edge of the substrate 212. The driving circuit 211 may input and output signals. The gate driver 214 may be regarded as a switch for driving the display region 220 (see FIG. 1) of the display device 200.

It is to be noted that the connection relationships and materials of the elements described above will not be repeated in the following description, and only aspects related to other types of display devices will be described.

Figure 4:
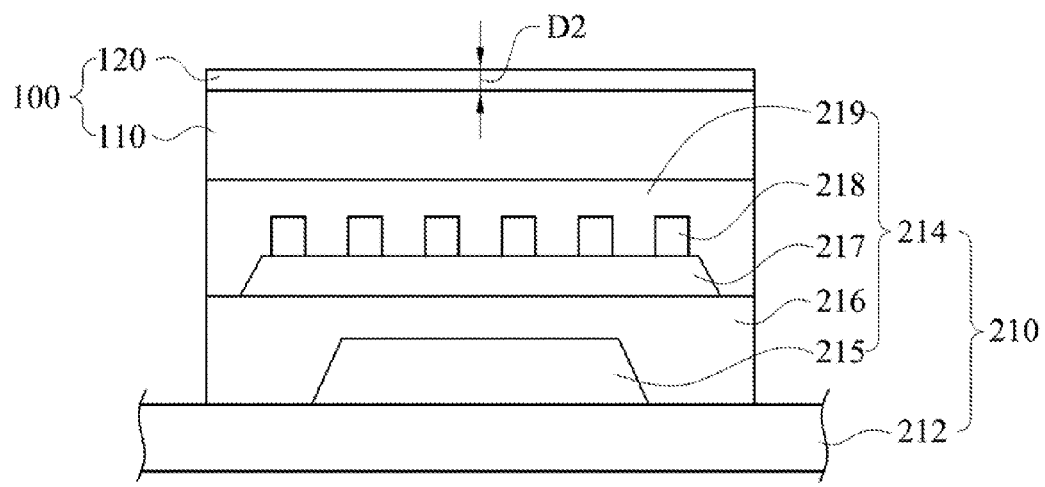
FIG. 4 is a cross-sectional view of a display device according to another embodiment of the present invention, in which a position of a cut line is the same that of FIGS. 2.

FIG. 4 is a cross-sectional view of a display device 200a according to another embodiment of the present invention, in which a position of a cut line is the same that of FIG. 2. As shown in FIG. 4, the display device 200a includes the display panel 210 and the circuit protection structure 100. The display panel 210 has the substrate 212 and the gate driver 214. The difference between this embodiment and the embodiment shown in FIG. 2 is that the circuit protection structure 100 of the display device 200a further includes a light shielding layer 120 besides the protection layer 110. The light shielding layer 120 is located on the protection layer 110, such that the protection layer 110 is between the light shielding layer 120 and the second isolation layer 219 of the gate driver 214. The light shielding layer 120 may be made of a material including metal. For example, the material of the light shielding layer 120 may be the same as the material of the first metal layer 215. Alternatively, the material of the light shielding layer 120 may be the same as the material of the second metal layer 128.

In this embodiment, the light shielding layer 120 substantially overlaps the protection layer 110. "Substantially" is used herein to refer to the fact that there may be differences as a result of manufacturing errors. The thickness D2 of the light shielding layer 120 may be in a range from 400 Å to 600 Å, such as 500 Å. Due to the property of metal material, the strength of the light shielding layer 120 is high, such that the strength of the gate driver 214 may be improved by the light shielding layer 120.

Moreover, since the light shielding layer 120 is located on the protection layer 110, light may be prevented from entering the semiconductor layer 217 of the gate driver 214. That is to say, when the semiconductor layer 217 is made of material including amorphous silicon (a-Si), the semiconductor layer 217 does not leak electricity even if the display device 200a is irradiated by sunlight or strong light, such that the gate driver 214 can output signals normally.

Therefore, the display device 200a having the circuit protection structure 100 may significantly improve the yield rate and the product reliability thereof, such that the display device 200a has good product competitiveness.

Figure 5:
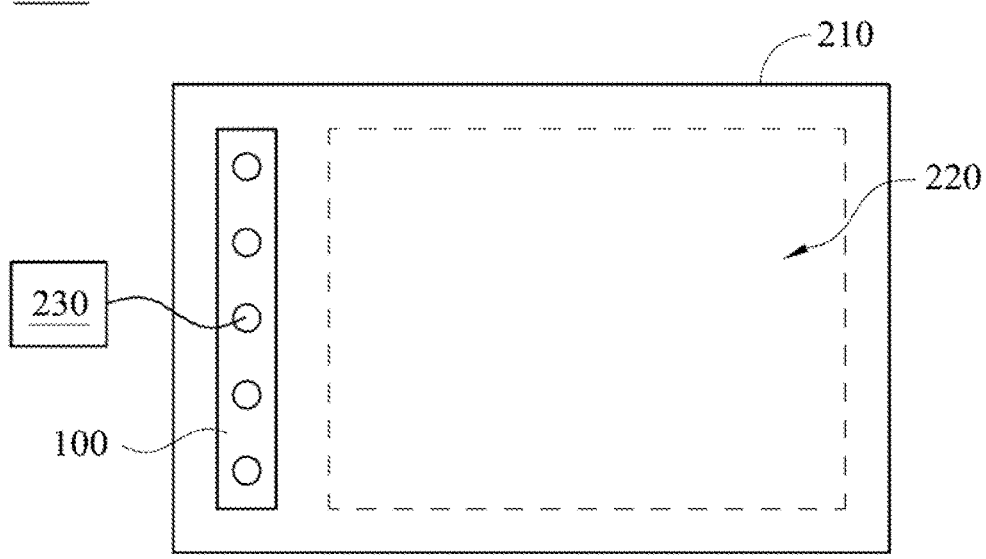
FIG. 5 is a top view of a display device according to another embodiment of the present invention.

FIG. 5 is a top view of a display device 200b according to another embodiment of the present invention. As shown in FIG. 5, the display device 200b includes the display panel 210 and the circuit protection structure 100. The display device 200b has the display region 220. The difference between this embodiment and the embodiment shown in FIG. 1 is that the display device 200b further includes a controller 230. The controller 230 is electrically connected to the gate driver 214 (see FIG. 2 or FIG. 4). In use, the controller 230 may turn on or turn off the display region 220 of the display device 200b by the gate driver 214. The controller 230 may be selectively disposed on the display panel 210 or separated from the display panel 210 with a distance, and the present invention is not limited in this regard. Moreover, in this embodiment, the protection structure 100 of the display device 200b may be the protection structure 100 shown in FIG. 2 or FIG. 4 as deemed necessary by designers.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. in view of the foregoing, it is intended that the present invention cover modifications and variations of this invention provided they fall within the scope of the following claims.

What is claimed is:

1. A circuit protection structure applied in a gate driver of a display device having a display region and a peripheral circuit region, and the gate driver in the peripheral circuit region and having a first metal layer, a first isolation layer, a semiconductor layer, a second metal layer, and a second isolation layer stacked on a substrate in sequence, and the circuit protection structure comprising:
   a protection layer directly in contact with the second isolation layer, wherein the protection layer does not extend into the display region, such that the protection layer is only located in the peripheral circuit region and out of the display region; and
   a light shielding layer completely covering the protection layer, such that the protection layer is between the light shielding layer and the second isolation layer, wherein the light shielding layer is physically in contact with the protection layer, wherein the light shielding layer and its orthogonal projection on the substrate completely cover an orthogonal projection of the first metal layer on the substrate, and completely cover an orthogonal projection of the semiconductor layer on the substrate.

2. The circuit protection structure of claim 1, wherein a material of the light shielding layer is the same as a material of the first metal layer.

3. The circuit protection structure of claim 1, wherein a material of the light shielding layer is the same as a material of the second metal layer.

4. The circuit protection structure of claim 1, wherein a thickness of the light shielding layer is in a range from 400 Å to 600 Å.

5. The circuit protection structure of claim 1, wherein the light shielding layer overlaps the protection layer.

6. The circuit protection structure of claim 1, wherein the protection layer is made of a material comprising photoresist.

7. The circuit protection structure of claim 1, wherein a thickness of the protection layer is in a range from 22,000 Å to 24,000 Å.

8. A display device having a display region and a peripheral circuit region, the display device comprising:
   a display panel having a gate driver and a substrate, wherein the gate driver is located on the substrate and in the peripheral circuit region, and the gate driver comprises:
      a first metal layer located on the substrate;
      a first isolation layer located on the first metal layer;
      a semiconductor layer located on the first isolation layer;
      a second metal layer located on the semiconductor layer; and
      a second isolation layer covering the second metal layer and the semiconductor layer; and
   a circuit protection structure located on the gate driver and comprising:
      a protection layer directly in contact with the second isolation layer, wherein the protection layer does not extend into the display region, such that the protection layer is only located in the peripheral circuit region and out of the display region; and
      a light shielding layer completely covering the protection layer, such that the protection layer is between the light shielding layer and the second isolation layer, wherein the light shielding layer is physically in contact with the protection layer, wherein the light shielding layer and its orthogonal projection on the substrate completely cover an orthogonal projection of the first metal layer on the substrate, and completely cover an orthogonal projection of the semiconductor layer on the substrate.

9. The display device of claim 8, wherein a material of the light shielding layer is the same as a material of the first metal layer.

10. The display device of claim 8, wherein a material of the light shielding layer is the same as a material of the second metal layer.

11. The display device of claim 8, wherein a thickness of the light shielding layer is in a range from 400 Å to 600 Å.

12. The display device of claim 8, wherein the light shielding layer overlaps the protection layer.

13. The display device of claim 8, wherein the protection layer is made of a material comprising photoresist.

14. The display device of claim 8, wherein a thickness of the protection layer is in a range from 22,000 Å to 24,000 Å.

15. The display device of claim 8, further comprising:
   a controller electrically connected to the gate driver.

* * * * *